(12) United States Patent
Thakur

(10) Patent No.: US 6,281,122 B1
(45) Date of Patent: Aug. 28, 2001

(54) METHOD FOR FORMING MATERIALS

(75) Inventor: Randhir P. S. Thakur, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/447,527

(22) Filed: Nov. 23, 1999

Related U.S. Application Data

(63) Continuation of application No. 08/795,258, filed on Feb. 10, 1997, now Pat. No. 5,990,006.

(51) Int. Cl.[7] .................................................. H01L 21/44
(52) U.S. Cl. .................... 438/676; 438/471; 438/476; 438/486; 438/487; 438/591; 438/677; 257/51; 257/66
(58) Field of Search .............................. 438/14, 676, 677, 438/591, 486, 487, 471, 476, 162, 166, 158, 517, 779

(56) References Cited

U.S. PATENT DOCUMENTS

| | | | |
|---|---|---|---|
| 4,246,298 | 1/1981 | Guarnery et al. | 427/46 |
| 4,558,660 | 12/1985 | Nishizawa et al. | 118/725 |
| 4,699,689 | 10/1987 | Bersin | 156/643 |
| 5,268,201 | 12/1993 | Komaki et al. | 427/255.1 |
| 5,449,799 | 9/1995 | Terfloth et al. | 556/112 |
| 5,510,158 | 4/1996 | Hiramoto et al. | 427/582 |
| 5,531,857 | 7/1996 | Engelsberg et al. | 156/345 |
| 5,580,421 | 12/1996 | Hiatt et al. | 150/643.1 |
| 5,658,417 | 8/1997 | Watanabe et al. | 156/345 |

Primary Examiner—David Nelms
Assistant Examiner—Reneé R Berry

(57) ABSTRACT

A semiconductor fabrication apparatus and methods for processing materials on a semiconductor wafer are disclosed. The fabrication apparatus is a processing chamber comprising: an ultraviolet radiation source and an infrared radiation source, the radiation sources symmetrically arranged such that radiation is substantially uniform throughout the chamber and the radiation sources being capable of being used as a film deposition radiation source or a film annealing radiation source or both; an ultraviolet radiation sensor and an infrared radiation sensor to provide a feedback loop to the ultraviolet radiation source and to the infrared radiation source, respectively, so that a desired level of ultraviolet radiation and infrared radiation is maintained inside the chamber. An exemplary method to utilize the semiconductor fabrication apparatus comprises processing a material on a semiconductor assembly during semiconductor fabrication, by the steps of: precleaning a semiconductor assembly in ultraviolet radiation, the step of precleaning performed prior to the step of forming; forming a film in ultraviolet radiation and infrared radiation; annealing the film ultraviolet light radiation and inspired radiation; wherein the ultraviolet radiation and the ed radiation are supplied by independently operable ultraviolet and infrared radiation sources within the same processing chamber.

10 Claims, 3 Drawing Sheets

METHOD FOR FORMING MATERIALS

This application is a continuation of U.S. Ser. No. 08/795,258 to U.S. Pat. No. 5,990,006, filed Feb. 10, 1997.

FIELD OF THE INVENTION

This invention relates to semiconductor technology and more specifically to an apparatus and method for forming materials, such as dielectric materials, for use in semiconductor devices.

BACKGROUND OF THE INVENTION

Photochemistry has become an important area to consider in the semiconductor fabrication process. The role of Photochemistry is expanding from diverse areas of biology and medicine to semiconductor processing. Due to chemical reactions involved in several semiconductor fabrication steps, the quality of the reactions can be controlled by selective use of photochemistry in general and photons in particular. The raw materials in Ultra Large Scale Integration (USLI) electronics involve thermal processing which can provide defect free engineering of a desired thin film.

As an example, for the deposition of superconducting thin films, rapid thermal processing (RTP) assisted metalorganic chemical vapor deposition (MOCVD) has provided encouraging process results using lower deposition temperatures. Although the decomposition pathways of most of the reactions are not accurately known, in general, most of the organometallics used in MOCVD have higher adsorption coefficients in ultraviolet (UV) and vacuum ultraviolet (VUV) regions. High energy photons, from the UV and VUV regions, provide excited but not dissociated complexes. Thus, in concert with the low energy photons (responsible for the thermal or pyrolysis deposition), the high energy photons can provide the ideal MOCVD approach for the growth of many materials.

A photochemical reaction is a chemical reaction which takes place only under the influence of light. For the purposes of Photochemistry, light is considered as being made up of individual photons of energy E=hv, where h is Planck's constant and v is the frequency of light Only light that is absorbed can result in a photochemical effect. On the molecular scale the photochemical reaction starts with the adsorption of a photon by a molecule. The molecule is thereby promoted to an excited state. The excited molecule is a new chemical species which has its own distinct chemical and physical properties.

Any photochemical event starts with the absorption of a photon by a molecule M, with production of an excited molecule M*, where M+hv=M* (adsorption). The excited molecule M* may now react chemically, either by rearrangement or, for instance, by reaction with another species N: M*+N=P. This step which involves, chemically, the excited molecule M*, is the primary photochemical process.

Another type of molecular excitation is rotational excitation which requires the smallest amount of energy. Rotational excitation results in a spinning of the molecule around a preferred axis. The molecule is however chemically unchanged With higher energies the molecule can be promoted to a vibrationally excited state. Here again the molecule is chemically unchanged as the energy is in the form of vibrations of various parts of the molecule. With even higher energies, the molecule will be electronically excited as one or several electrons are promoted to higher energy orbitals. Photochemical reactions occur from such electronically excited state of molecules.

The ground state of the atom is the state in which all the electrons fill the available orbitals in the order of increasing energy. An electronically excited state is a state in which one or several electrons occupy higher energy orbitals, having left one or several vacancies in the lower orbitals. A ground state can only adsorb light, it cannot emit light. An excited state can either emit light (thus moving downwards in energy to the ground state or to a lower excited state) or absorb light (thus moving upwards in energy to a higher excited state).

In literature it is also known that an VUV lamp greatly improves the quality of dielectric films, such as $Y_2O_3$ films and superconducting films (YBCO complexes) due to the use of higher energy photons in the deposition process. The heating source configuration plays an important role in film deposition, which is very useful in the optimization of lamp energy source design. The leakage current density of dielectric films is good enough to replace conventional oxides as the insulator in the devices processing. Quality films can be grown at low substrate temperature by using VUV lamps as the source of optical energy.

The present invention provides an apparatus and method for commercial semiconductor fabrication that uses the combination of UV lamps and infrared radiation sources to form and condition films, such as dielectric films.

SUMMARY OF THE INVENTION

An exemplary implementation of the present invention discloses a fabrication apparatus for use in the processing of films using the combination of UV lamps and infrared radiation sources.

A another exemplary implementation of the present invention discloses a film processing (i.e., film deposition and film annealing) apparatus used for fabricating semiconductor devices which uses the combination of UV lamps and infrared radiation sources to form and condition films.

A another exemplary implementation of the present invention discloses a method to deposit or anneal films on a semiconductor assembly using the disclosed film processing apparatus. The desired radiation sources are turned on at a desired point in a fabrication cycle to form a desired film.

DETAILED DESCRIPTION OF THE INVENTION

Figure 1:
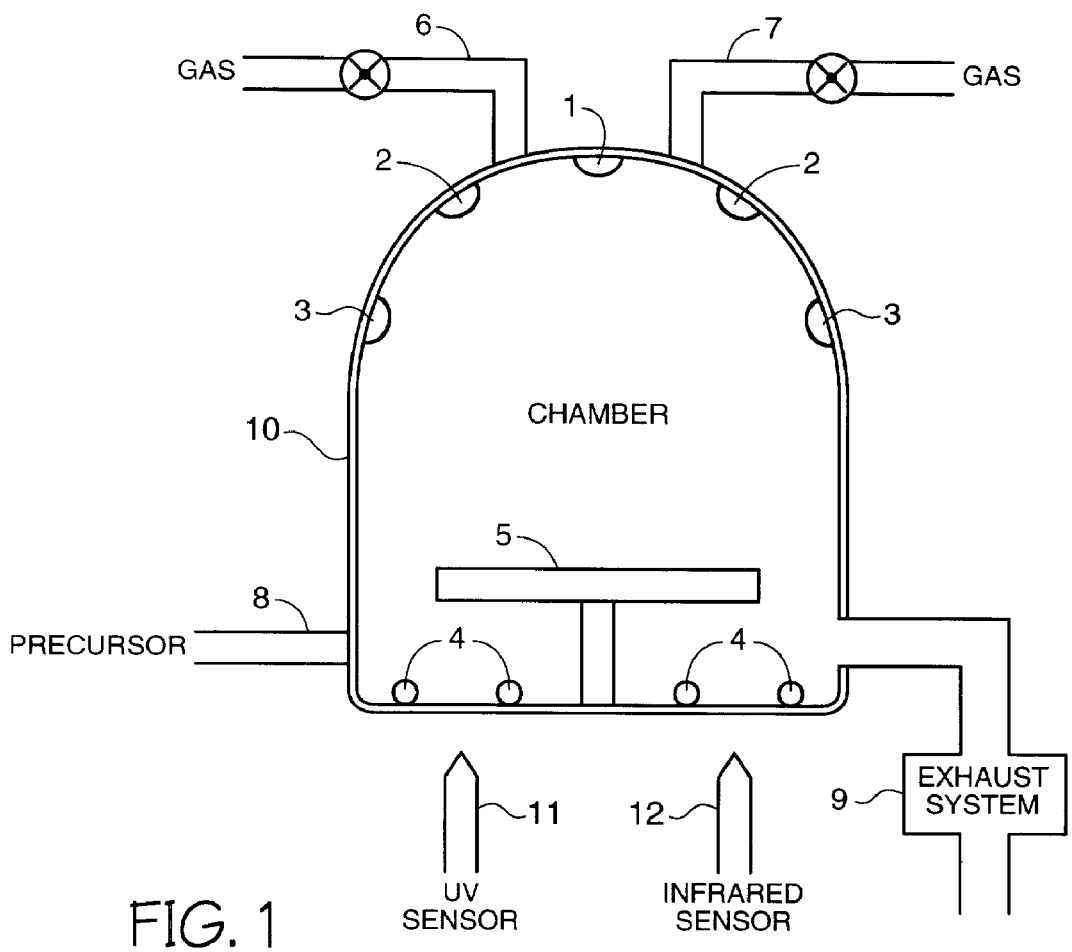
FIG. 1 shows a cross-sectional view of a semiconductor processing apparatus having a combination of UV lamps and infrared radiation sources.
Figure 2:
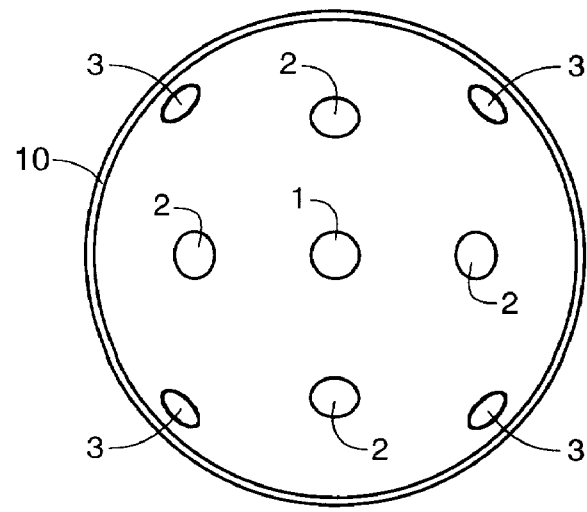
FIG. 2 shows an overhead view of the semiconductor processing apparatus of FIG. 1, further illustrating a combination of UV lamps and infrared radiation sources.

An exemplary implementation of the present invention is depicted in the cross-sectional view of FIG. 1 and the overhead view of FIG. 2. This exemplary implementation will be appreciated by one skilled in the art, as taught from the following description.

FIG. 1, depicts an exemplary implementation of the present invention, by showing an semiconductor film processing apparatus that utilizes both ultraviolet (UV) lamps and infrared radiation sources (such as radiation coils or lamps). In the following discussion, the term radiation bank is used and is defined as a radiation energy source that may be a single radiation element, such as a single UV lamp or a single infrared radiation coil (or infrared radiation lamp). Furthermore, the radiation source may have multiple UV lamps or multiple radiation infrared coils (or infrared radiation lamps), or a combination of both.

Referring now to FIG. 1, the processing apparatus is made up of chamber 10 which houses radiation banks 1, 2, 3 and 4 and semiconductor assembly holding structure 5. Gas inlets 6 and 7 provide access to the desired gas source. Precursor inlet 8 provides access to the desired precursor source. Exhaust system 9 provides an escape route for materials or gases that must be discharged from chamber 10 during or after the process. With the combination of both UV lamps and infrared radiation sources, the apparatus may also have UV sensor 11 and infrared sensor 12 which are capable of monitoring and providing the appropriate feedback to chamber 10 in order to maintain the desired radiation levels. The sensors used may be contact or non-contact sensors. For example, sensors that may be used include, an optical fiber probe, a thermocouple, a susceptor with a thermocouple buried inside, or a plate where the sensor is positioned above and below the plate.

FIG. 2 further illustrates, by a representative overhead view, the positioning of radiation banks 1, 2 and 3. Though FIG. 2 shows only three radiation banks, the system may have more or less than three radiation banks in order to provide the most desirable apparatus for a given fabrication process.

Referring now to FIG. 2, the UV lamps and infrared radiation coils are positioned in a series of radiation banks and it is preferred that they are positioned such that uniform radiation is present inside the chamber and thus to a semiconductor wafer being processed, when the selected radiation banks are on. A way to obtain uniform radiation throughout chamber 10 would be to position the lamps in a symmetrical fashion or arranged axisymmetrically about a central location within chamber 10. For example, radiation bank 1 could be a UV lamp centrally positioned within chamber 10. Radiation bank 2 could a series of infrared radiation coils being positioned about radiation bank 1 at equal distance from radiation bank 1 as well as being equal distance from each other. Radiation bank 3 could be a series of UV lamps being position at an equal distance from radiation bank 1, radiation bank 2 and as well as being equal distance from each UV position in radiation bank 3. This pattern would continue until all radiation banks desired were positioned within chamber 10. As mentioned above, each radiation bank could contain a combination of UV lamps and infrared radiation coils if so desired. However, each type of radiation source (UV lamps versus infrared radiation coils) must be operable independent of each other, so that if a particular application calls for only the use of UV radiation or only the use of infrared radiation during a particular processing step, the desired radiation source(s) are capable of being turned on independently. The arrangement of radiation sources inside chamber 10, as described above will provide uniform radiation to a semiconductor assembly, such as a semiconductor wafer, that is placed inside chamber 10 for fabrication processing.

Figure 3:
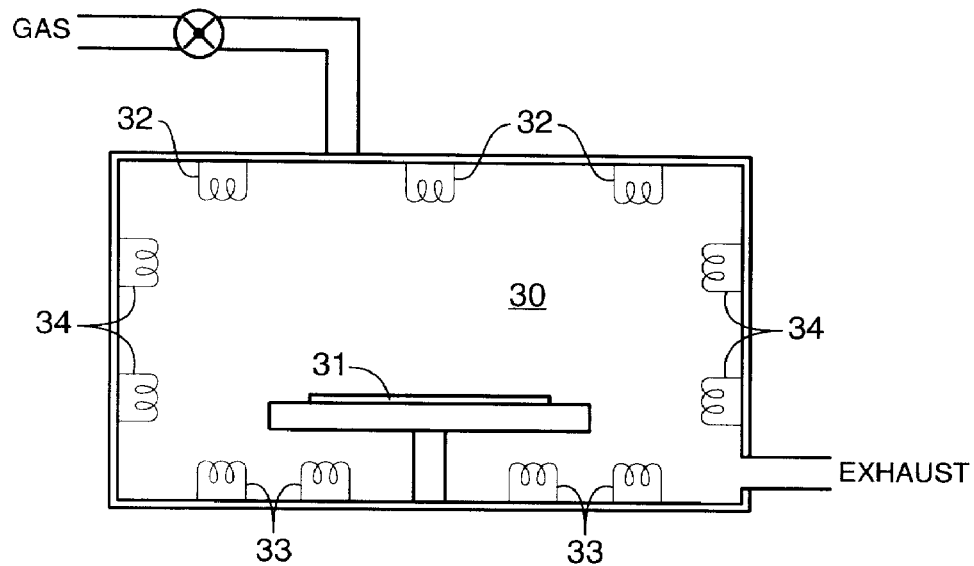
FIG. 3 shows a cross-sectional view of a semiconductor processing apparatus having a combination of UV lamps and high power lamps, such as tungsten halogen lamps.

FIG. 3 depicts a chamber 30 similar to chamber 10 of FIG. 1, with the obvious exception that the chambers may be a shaped differently (although chamber 30 may be shaped differently than depicted in FIG. 3, as well). In FIG. 3, the front side of a semiconductor wafer 31 is irradiated by UV lamps 32, while the backside of semiconductor wafer 31 is irradiated by high powered lamps 33, such as tungsten halogen lamps, that possess wavelengths of light that are much longer than the UV wavelength of sources used. The radiation sources of chamber 30 may also be arranged such that optional UV lamps 34 are placed along the sidewalls of chamber 30.

Having the capability to process a wafer using different radiation sources provides overall defect density and properties improvement of a given film. For example, different gas sources in conjunction with plasma, will enhance the deposition process of a given film. However, plasma introduces impurities, such as metallics and ionic impurities (impurity species), into the resulting deposited film. By using UV light treatment in combination with a plasma source, films properties can be improved as the UV light will cause the impurity species to become chemically volatile so they can be removed from the deposition system prior to reaching the surface of the wafer. The UV treatment can be carried out pre, during or post processing.

Figure 4:
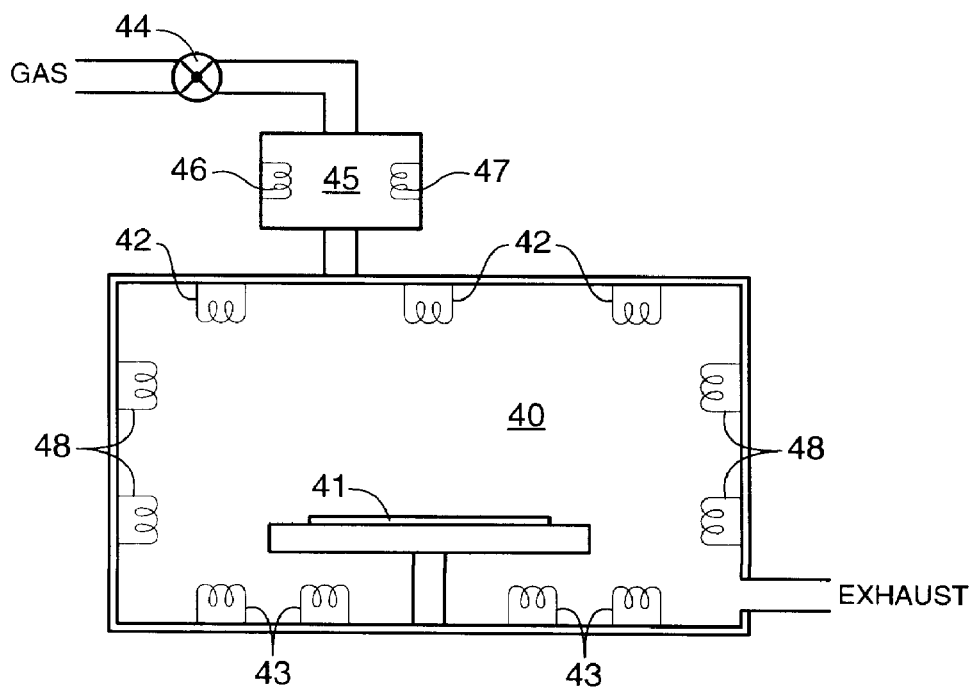
FIG. 4 shows a cross-sectional view of a semiconductor processing apparatus having a combination of UV lamps and infrared radiation sources and a gas preheating chamber having a combination of UV lamps and high power lamps, such as tungsten halogen lamps.

FIG. 4 depicts a chamber 40 similar to the chamber 10 of FIG. 1, with the obvious exception that the chambers may be a shaped differently (though, chamber 40 may be shaped differently than it is depicted). In FIG. 4, the front side of a semiconductor wafer 41 is irradiated by UV lamps 42, while the backside of semiconductor wafer 41 is irradiated by resistive radiation coils 43. The radiation sources of chamber 40 may also be arranged such that optional UV lamps 48 are placed along the side walls of chamber 40. Further depicted in FIG. 4 is the use of a source gas preheating chamber 45, that uses both UV lamps 46 and tungsten halogen lamps 47 to preheat the gas stream that is available through gas inlet 44. Preheating the source gas will cause the reaction chemistry of the source gas to change. During this photochemical change, the UV light will help remove impurities residing in the gases before deposition occurs. Both lamp types provide advantages by using them in combination as the tungsten lamps are needed to raise the temperature of wafer to allow for depositions of certain materials, while the UV lamps help remove gas impurities from the system before deposition occurs, as mentioned above.

The wavelength of the UV lamps (50 nm–300 nm) selected for a particular deposition chamber would depend on a given process for a given film. That is to say, the UV lamp selected will depend on the material used so that the electromagnetic spectrum of the light source used coincides with the adsorption spectrum of the material to be deposited. For example, the wavelength of a UV lamp, or the wavelengths of a combination of UV lamps selected, would be dependent on a particular precursor that will be used as a source to deposit a particular film. Also, various different types of UV sources, possessing approximately the same light wavelength, could be operated during the same processing cycle. Furthermore, an apparatus using a UV scanning laser during film processing could be used. The UV scanning laser, having the appropriate UV light wavelength would subject the semiconductor wafer being processed and thus expose a deposited film to UV radiation. In fact, the film could be scanned with multiple wavelengths of different lasers.

In any of the chambers depicted above, the chambers are capable of running at a preferred temperature of 200–1200° C. and at a pressure of $10^{-10}$Torr to 760Torr or even at pressure above the atmospheric pressure. Optimally, for a given temperature, the apparatus is capable of being adjusted so that a desired photon flux density is maintained from the radiation sources used in order to support the reaction kinetics for a given reaction chemistry. Furthermore, any one of the chambers may use an adjustable radiation diffuser placed between the radiation sources and the semiconductor wafer(s) that is capable of adjusting the direction and intensity of the radiation emitted from the various radiation sources.

Exemplary processing methods, using the processing apparatuses of FIGS. 1–4, are depicted in FIG. 5. As shown, FIG. 5 represents various processing cycles which characterize the versatility of the processing apparatuses of FIGS. 1–4. These exemplary processing methods will be appreciated by one skilled in the art, as taught from the following description.

FIG. 5 shows various processing cycles (FIGS. 5a–5e) that are possible when using the apparatuses of FIGS. 1–4. Each graph is plotted with processing temperature (in degrees Celsius) versus processing time (in seconds). In FIG. 5a, a semiconductor assembly, such as a semiconductor wafer, is subjected to a deposition cycle, followed by an anneal cycle. In this case, the deposition temperature is higher than the anneal temperature, which provides a processing advantage of UV enhanced chemical vapor deposition (CVD) reaction. A UV enhanced CVD reaction promotes the desired photophysical and photochemical reactions and suppresses undesired reactions.

For example, using UV radiation during implant activation will reduce the damage to a lattice structure of a semiconductor substrate, because use of UV radiation allows the implant activation to be performed at a temperature lower than one typically used for implant activation, and yet, will cause activation of the desired dopants. Also, using UV radiation to anneal a dielectric which has undesired impurities such as carbon, sodium, iron, etc., helps to remove these impurities.

Figure 5A:
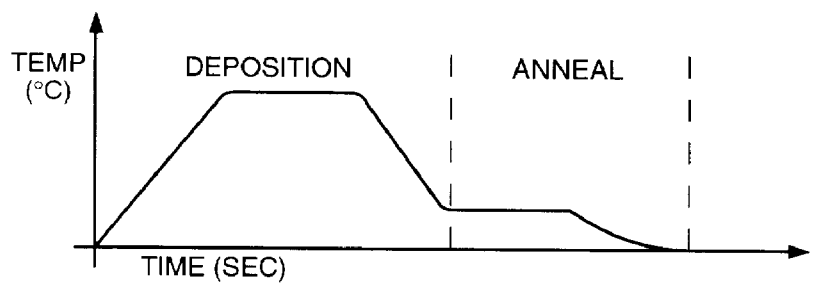
FIG. 5 depicts exemplary processing cycles employed during use of any one of the semiconductor processing apparatuses of FIGS. 1–4, for the processing of a desired film.
Figure 5B:
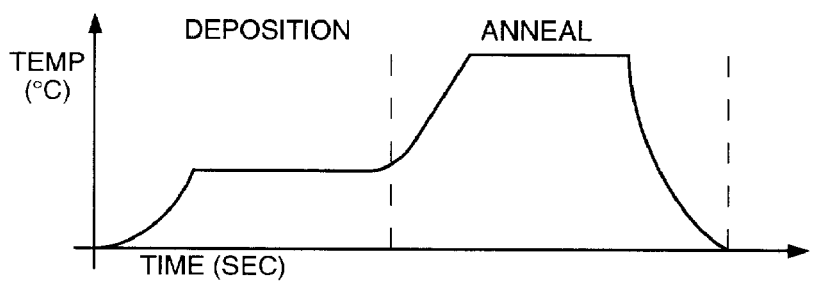

In FIG. 5b, a semiconductor assembly, such as a semiconductor wafer, is subjected to a deposition cycle, followed by an anneal cycle. In this case, a deposition temperature is lower than the anneal temperature, which provides a processing advantage of low temperature deposition of complex compounds, such as BST, which require a low deposition temperature and a rapid high temperature anneal.

Figure 5C:
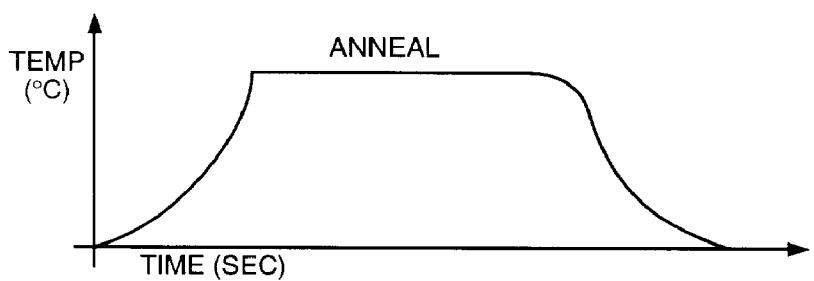

In FIG. 5c, a semiconductor assembly, such as a semiconductor wafer, is subjected to only an anneal cycle. In this case, the anneal cycle provides a processing method for annealing simple systems, such as yttrium oxide ($Y_2O_3$) and boron nitride (BN).

Figure 5D:
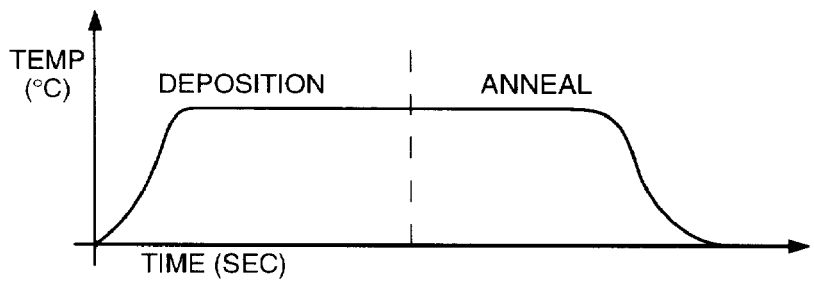

In FIG. 5d, a semiconductor assembly, such as a semiconductor wafer, is subjected to a deposition cycle, followed by an anneal cycle. In this case, a deposition temperature is the same as the anneal temperature, which allows processing of a film that would require these processing temperatures.

Figure 5E:
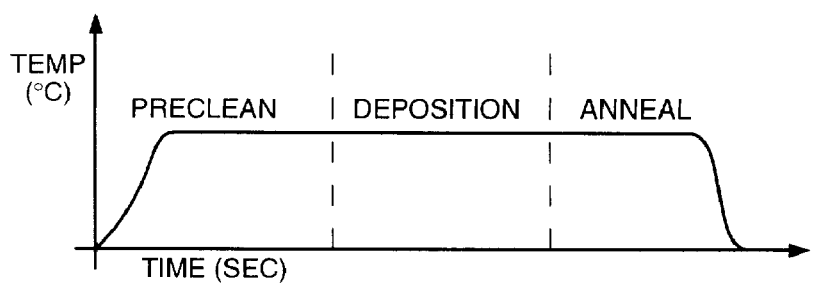

In FIG. 5e, a semiconductor assembly, such as a semiconductor wafer, is subjected to a preclean cycle, followed by a deposition cycle, followed by an anneal cycle. In this case, the preclean temperature, the deposition temperature and the anneal temperature are the same, which allows processing of a film that would require these processing temperatures.

Using UV light or VUV light during an annealing period is very effective as the higher energy photons also activate the semiconductor substrate surface, leading to better interfaces between the substrate and the deposited films. On the molecular scale, the photochemical reaction starts with the adsorption of a photon by a molecule, for example the molecules of a deposited dielectric layer. The molecules are thereby promoted to an excited state and promote new chemical species which have their own distinct chemical and physical properties. As the photochemical event starts with the absorption of a photon by the dielectric molecule, the excited dielectric molecule may now react chemically with another species that is provided by the ambient during the process cycle.

For example, during densification, the oxygen vacancies in a dielectric layer are filled by the mobile atomic oxygen which are been created by exposing the dielectric layer to UV light The UV light also promotes energy which tends to break some of the weaker, less stable bonds in the dielectric material. These broken bonds can then be passivated by the atomic oxygen present and these passivated bonds will then come to equilibrium in a more stable configuration. Overall, this UV anneal eliminates the vacancies and weak bonds in the material which would otherwise provide leakage current paths if still present The presence of the UV radiation sources allow for a wide temperature range that may be used during various processes. If low temperature is desired, due to thermal budget constraints, UV anneals provide a solution since the photon energy, in addition to thermal energy, work together to condition the film. This allows the anneal temperature to be lower than if thermal energy alone was used. The UV anneal can also be done at higher temperatures if that is required for a specific application. This might be the case if it is beneficial to have the material in a stable crystal phase following the anneal.

By performing the deposition and anneals insitu, contamination is reduced since no wafer transfers are required. Insitu processing also provides throughput advantages and avoids exposure of material to moisture prior to densification, which is important for hydroscopic materials. Since hydroscopic materials absorb water, it is important to avoid exposing them to water in order to maintain a stable material. From the exemplary implementations of the present invention, it will be evident to those having ordinary skill in the art of semiconductor fabrication that changes and modifications may be made thereto without departing from the scope and spirit of the invention as claimed.

What is claimed is:

1. A method for processing a material on a semiconductor assembly during a semiconductor fabrication process, said method comprising the steps of:

depositing a film on said semiconductor assembly under exposure to ultraviolet radiation and infrared radiation, said semiconductor assembly being exposed to said ultraviolet radiation and said infrared radiation in combination for at least a portion of time during said step of depositing;

annealing said film in only infrared radiation.

2. The method as recited in claim 1, further comprising maintaining said semiconductor assembly substantially stationary during said step of depositing and said step of annealing.

3. A method for processing a material on a semiconductor assembly during a semiconductor fabrication process, said method comprising the steps of:

depositing a film in only infrared radiation;

annealing said film on under exposure to ultraviolet radiation and infrared radiation, said film being exposed to said ultraviolet radiation and said infrared radiation in combination for at least a portion of time during said step of annealing.

4. The method as recited in claim 3, further comprising maintaining said semiconductor assembly substantially stationary during said step of depositing and said step of annealing.

5. A method for processing a material on a semiconductor assembly during a semiconductor fabrication process, said method comprising the steps of:

depositing a film under exposure to ultraviolet radiation and infrared radiation;

annealing said film under exposure to ultraviolet radiation and infrared radiation, said film being exposed to said ultraviolet radiation and said infrared radiation in combination for at least a portion of time during said step of annealing.

6. The method as recited in claim 5, further comprising maintaining said semiconductor assembly substantially stationary during said step of depositing and said step of annealing.

7. A method for processing a material on a semiconductor assembly during a semiconductor fabrication process, said method comprising the steps of:

precleaning said semiconductor assembly in ultraviolet radiation prior to depositing a film on said semiconductor assembly;

depositing a film under exposure to ultraviolet radiation and infrared radiation, said film being exposed to said ultraviolet radiation and said infrared radiation in combination for at least a portion of time during said step of forming;

annealing said film under exposure to ultraviolet radiation and infrared radiation, said film being exposed to said ultraviolet radiation and said infrared radiation in combination for at least a portion of time during said step of annealing.

8. The method as recited in claim 7, further comprising maintaining said semiconductor assembly substantially stationary during said steps of precleaning, depositing and annealing.

9. A method for processing a material on a semiconductor assembly during a semiconductor fabrication process, said method comprising the steps of:

preheating a gas prior to said gas entering a processing chamber;

precleaning said semiconductor assembly under ultraviolet radiation prior to depositing a film on said semiconductor assembly;

depositing a film on said semiconductor assembly under exposure to ultraviolet radiation and infrared radiation, said film being exposed to said ultraviolet radiation and said infrared radiation in combination for at least a portion of time during said step of depositing;

annealing said film under exposure to ultraviolet radiation and infrared radiation, said film being exposed to said ultraviolet radiation and said infrared radiation in combination for at least a portion of time during said step of annealing.

10. The method as recited in claim 9, further comprising maintaining said semiconductor assembly substantially stationary during said steps of precleaning, depositing and annealing.

* * * * *